(12) United States Patent
Teo et al.

(10) Patent No.: US 8,328,435 B2
(45) Date of Patent: Dec. 11, 2012

(54) PRINTED CIRCUIT BOARD POSITIONING SPACERS IN AN OPTOELECTRONIC MODULE

(75) Inventors: Tat Ming Teo, Singapore (SG); Chris K. Togami, San Jose, CA (US); Frank Flens, Campbell, CA (US)

(73) Assignee: Finisar Corporation, Sunnyvale, CA (US)

( * ) Notice: Subject to any disclaimer, the term of this patent is extended or adjusted under 35 U.S.C. 154(b) by 218 days.

(21) Appl. No.: 12/629,673

(22) Filed: Dec. 2, 2009

(65) Prior Publication Data

US 2010/0080518 A1    Apr. 1, 2010

Related U.S. Application Data

(63) Continuation-in-part of application No. 12/468,790, filed on May 19, 2009, now Pat. No. 8,057,109.

(60) Provisional application No. 61/128,337, filed on May 20, 2008.

(51) Int. Cl.
*G02B 6/36*  (2006.01)
*H05K 1/14*  (2006.01)

(52) U.S. Cl. .......................... 385/92; 361/804

(58) Field of Classification Search .................. None
See application file for complete search history.

(56) References Cited

U.S. PATENT DOCUMENTS

| | | | |
|---|---|---|---|
| 4,636,018 A * | 1/1987 | Stillie | 439/66 |
| 5,214,730 A | 5/1993 | Nagasawa et al. | |
| 5,619,604 A | 4/1997 | Shiflett et al. | |
| 5,743,785 A | 4/1998 | Lundberg et al. | |
| 6,085,003 A | 7/2000 | Knight | |
| 6,848,836 B2 | 2/2005 | Ueda et al. | |
| 6,886,988 B2 | 5/2005 | Brown et al. | |
| 7,156,562 B2 | 1/2007 | Mazotti et al. | |
| 7,217,043 B2 | 5/2007 | Schunk | |
| 7,309,173 B2 | 12/2007 | Epitaux et al. | |
| 7,731,432 B2 | 6/2010 | Theodoras et al. | |
| 7,766,672 B1 * | 8/2010 | Chiang | 439/76.1 |
| 8,057,109 B2 | 11/2011 | Flens et al. | |
| 2002/0115342 A1 | 8/2002 | Stricot et al. | |

(Continued)

FOREIGN PATENT DOCUMENTS

EP    0439939    9/1995

(Continued)

OTHER PUBLICATIONS

Chris Togami et al., Communications Module Integrated Boot and Release Slide, U.S. Appl. No. 12/685,916, filed Jan. 12, 2010.

(Continued)

*Primary Examiner* — Sarah Hahm
(74) *Attorney, Agent, or Firm* — Maschoff Gilmore & Israelsen

(57) ABSTRACT

Printed circuit board (PCB) positioning spacers in an optoelectronic module. In one example embodiment, an optoelectronic module includes a housing comprising a top shell and a bottom shell, top and bottom printed circuit boards (PCBs) at least partially enclosed within the housing, and a spacer positioned between the first and second PCBs. The spacer includes top and bottom surfaces, a plurality of top posts extending from the top surface, and a bottom post extending from the bottom surface. The top posts extend through openings in the top PCB to contact one or more inside surfaces of the top shell. The bottom post extends through an opening in the bottom PCB to contact an inside surface of the bottom shell.

20 Claims, 6 Drawing Sheets

U.S. PATENT DOCUMENTS

| | | | |
|---|---|---|---|
| 2003/0048996 | A1 | 3/2003 | Lowe et al. |
| 2004/0120660 | A1 | 6/2004 | Go et al. |
| 2005/0254821 | A1 | 11/2005 | Theodoras |
| 2005/0259994 | A1 | 11/2005 | Zhano et al. |
| 2005/0265650 | A1 | 12/2005 | Priyadarshi et al. |
| 2006/0262026 | A1 | 11/2006 | Gainey et al. |
| 2008/0226239 | A1 | 9/2008 | Oki et al. |
| 2009/0253292 | A1* | 10/2009 | Wu .............................. 439/493 |
| 2009/0290619 | A1 | 11/2009 | Flens et al. |
| 2010/0296817 | A1 | 11/2010 | Togami et al. |

FOREIGN PATENT DOCUMENTS

| | | |
|---|---|---|
| JP | 09-171127 | 6/1997 |
| WO | 2009143293 | 11/2009 |

OTHER PUBLICATIONS

Chris Togami et al., Simplified and Shortened Parallel Cable, U.S. Appl. No. 12/717,352, filed Mar. 4, 2010.

Tat Ming Teo et al., Latching Mechanism for a Module, U.S. Appl. No. 12/573,637, filed Oct. 5, 2009.

The International Search Report and the Written Opinion of the International Searching Authority, International Application No. PCT/US2009/044740, date of mailing Jun. 7, 2010.

Chris Togami et al., Electromagnetic Radiation Containment in an Optoelectronic Module, U.S. Appl. No. 12/629,650, filed Dec. 2, 2009.

Supplementary European Search Report completed Aug. 24, 2011 in connection with corresponding European Patent Application No. 09 75 1521 (5 pgs).

Office Action mailed Feb. 3, 2011 as received in in U.S. Appl. No. 12/468,790.

Notice of Allowance mailed Jun. 29, 2011 as received in in U.S. Appl. No. 12/468,790.

U.S. Appl. No. 12/685,916, mailed Oct. 7, 2011, Notice of Allowance.

\* cited by examiner

PRINTED CIRCUIT BOARD POSITIONING SPACERS IN AN OPTOELECTRONIC MODULE

CROSS-REFERENCE TO RELATED APPLICATIONS

This application is a continuation-in-part of U.S. patent application Ser. No. 12/468,790, filed on May 19, 2009, which claims the benefit of U.S. Provisional Patent Application Ser. No. 61/128,337, filed on May 20, 2008, each of which is incorporated herein by reference in its entirety.

BACKGROUND

Optoelectronic modules, such as optoelectronic transceiver or transponder modules, are increasingly used in electronic and optoelectronic communication. Optoelectronic modules generally include an outer housing that at least partially encloses one or more transmitters and/or receivers, as well as one or more printed circuit boards (PCBs) with circuitry related to the transmitters/receivers, such as driving and amplifying circuitry. Electrical data signals generally pass through this circuitry as they pass between the transmitters/receivers and a host device in which the optoelectronic module is positioned.

Optoelectronic module Multi-Source Agreements ("MSAs") specify among other things, package dimensions for optoelectronic modules. Conformity with an MSA allows an optoelectronic module to be plugged into a host device designed in compliance with the MSA. Some MSAs also specify positioning requirements for the PCB or PCBs relative to the housing. These positioning requirements can be difficult to achieve during the assembly of the PCB or PCBs within the housing. This difficulty is compounded when housing is a multi-piece housing and the optoelectronic module includes multiple PCBs.

BRIEF SUMMARY OF SOME EXAMPLE EMBODIMENTS

In general, example embodiments of the invention relate to printed circuit board (PCB) positioning in an optoelectronic module. This PCB positioning is achieved using a spacer that is positioned between top and bottom PCBs that are at least partially enclosed within top and bottom shells of an optoelectronic module housing. At least some example embodiments of the spacer enable the top and bottom PCBs to be properly positioned with respect to the top and bottom shells and also prevent warping of the top and bottom shells and the top and bottom PCBs.

In one example embodiment, an optoelectronic module includes a housing comprising a top shell and a bottom shell, top and bottom printed circuit boards (PCBs) at least partially enclosed within the housing, and a spacer positioned between the first and second PCBs. The spacer includes top and bottom surfaces, a plurality of top posts extending from the top surface, and a bottom post extending from the bottom surface. The top posts extend through openings in the top PCB to contact one or more inside surfaces of the top shell. The bottom post extends through an opening in the bottom PCB to contact an inside surface of the bottom shell.

In another example embodiment, an optoelectronic module includes a housing comprising a top shell and a bottom shell, top and bottom PCBs at least partially enclosed within the housing, a spacer positioned between the top and bottom PCBs, top compressible structures compressed between the spacer and the top PCB, and bottom compressible structures compressed between the bottom shell and the bottom PCB. The top compressible structures bias the top PCB against the top shell. The bottom compressible structures bias the bottom PCB against the spacer.

In yet another example embodiment, an active cable includes a communications cable having one or more optical fibers and having first and second ends. The active cable also includes first and second optoelectronic modules attached to the first and second ends of the communications cable, respectively. Each optoelectronic module includes a housing having a top shell and a bottom shell, top and bottom PCBs at least partially enclosed within the housing, a spacer positioned between the first and second PCBs, top compressible structures compressed between the spacer and the top PCB, and bottom compressible structures compressed between the bottom shell and the bottom PCB. The top shell defines a plurality of datum surfaces. The spacer includes top and bottom surfaces and a plurality of top posts extending from the top surface. The top posts extend through openings in the top PCB to contact the datum surfaces of the top shell. The top compressible structures bias the top PCB against the datum surfaces of the top shell. The bottom compressible structures bias the bottom PCB against the spacer.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features will be set forth in the description which follows, and in part will be obvious from the description, or may be learned by the practice of the teachings herein. Features of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

To further clarify certain aspects of the present invention, a more particular description of the invention will be rendered by reference to example embodiments thereof which are disclosed in the appended drawings. It is appreciated that these drawings depict only example embodiments of the invention and are therefore not to be considered limiting of its scope. Aspects of the invention will be described and explained with additional specificity and detail through the use of the accompanying drawings in which.

DETAILED DESCRIPTION OF SOME EXAMPLE EMBODIMENTS

Example embodiments of the present invention relate to printed circuit board (PCB) positioning in an optoelectronic module. This PCB positioning is achieved using a spacer that is positioned between top and bottom PCBs that are at least partially enclosed within top and bottom shells of an optoelectronic module housing. At least some example embodiments of the spacer enable the top and bottom PCBs to be properly positioned with respect to the top and bottom shells and also prevent warping of the top and bottom shells and the top and bottom PCBs.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

1. Example Optoelectronic Module

Figure 1A:
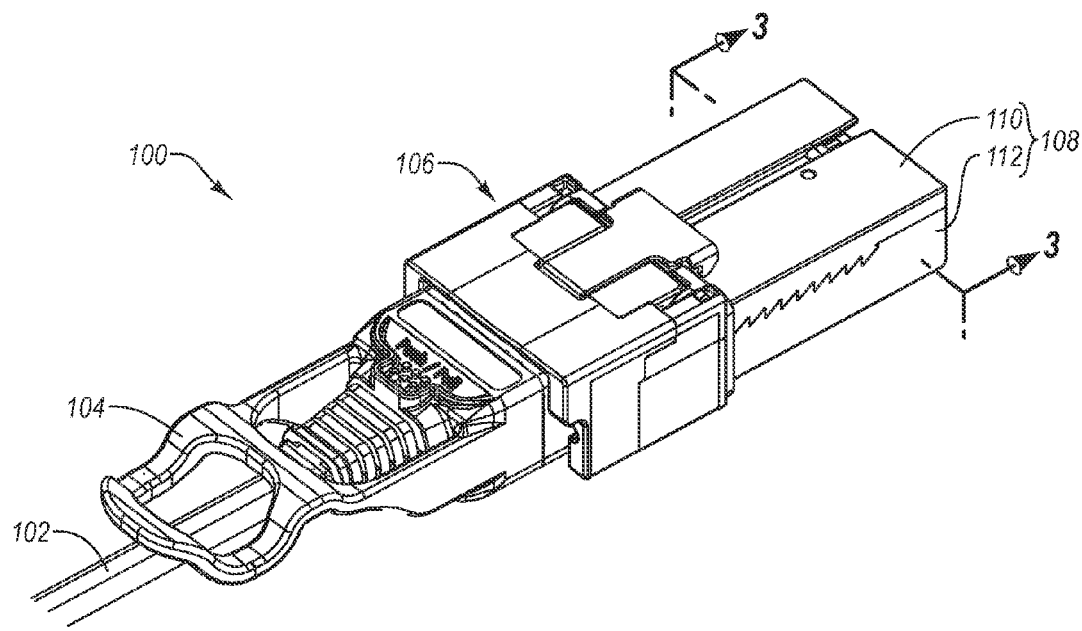
FIG. 1A is a top front perspective view of an example optoelectronic module and an attached ribbon cable.
Figure 1B:
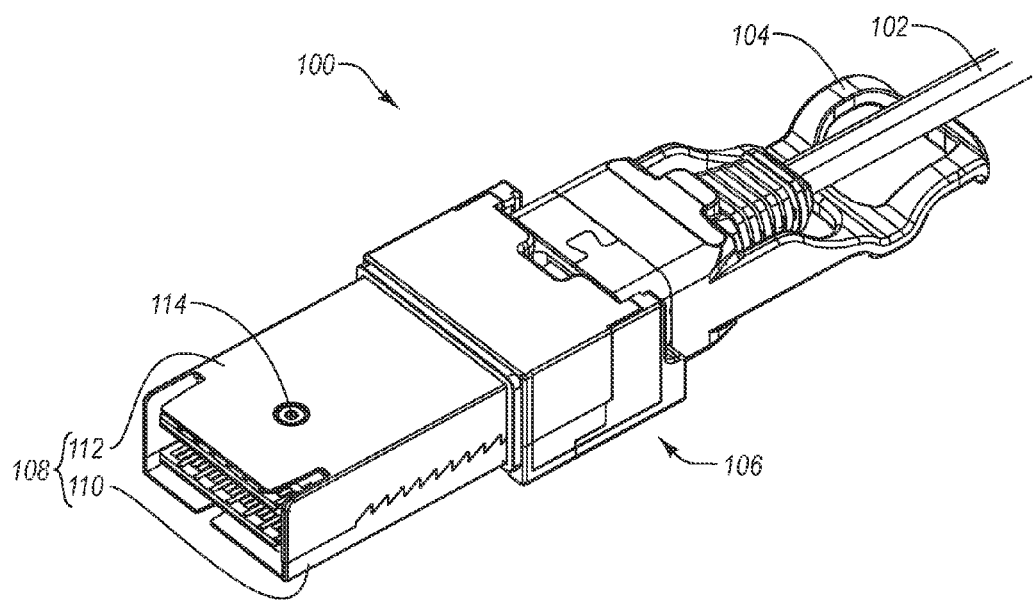
FIG. 1B is a bottom rear perspective view of the example optoelectronic module and attached ribbon cable of FIG. 1A.

Reference is first made to FIGS. 1A and 1B, which are top and bottom perspective views of an example optoelectronic module 100 for use in transmitting and receiving optical signals in connection with one or more other devices on a network, and communicating via electrical signals with a host device. As disclosed in FIGS. 1A and 1B, the optoelectronic module 100 is permanently attached to a communications cable 102, and thus the optoelectronic module 100 represents one end of an "active cable" which includes another optoelectronic module (not shown) permanently attached to the other end of the communications cable 102.

It is understood, however, that the communications cable 102 could instead be releasably connected to the optoelectronic module 100, in which case the optoelectronic module 100 would function as a stand-alone optoelectronic module. For example, where the communications cable 102 is a fiber-optic ribbon cable, the communications cable 102 can be terminated on one or both ends with a multi-fiber push on (MPO) male connector and the optoelectronic module 100 can include a corresponding MPO female connector configured to pluggably receive the MPO male connector.

The communication cable 102 is a multichannel fiber-optic ribbon cable that includes twenty four (24) fibers, with twelve (12) of the fibers being employed to transfer data signals in one direction, and the other twelve (12) fibers being employed to transfer data signals in the opposite direction. It is understood that other communications cable configurations can be substituted for the configuration of the communications cable 102 with a greater or lesser number of fibers.

The optoelectronic module 100 can be configured for optical signal transmission and reception at a variety of per-second data rates including, but not limited to, 150 Gbit or higher. Further, the optoelectronic module 100 can be configured for optical signal transmission and reception at various wavelengths including, but not limited to, 850 nm, 1310 nm, 1470 nm, 1490 nm, 1510 nm, 1530 nm, 1550 nm, 1570 nm, 1590 nm, 1610 nm, or longer wavelengths. Also, the optoelectronic module 100 can be configured to support various communication protocols including, but not limited to, INFINIBAND, Fast Ethernet, Gigabit Ethernet, 10 Gigabit Ethernet, 1×, 2×, 4×, 8×, and 10× Fibre Channel, and SONET OC-3, OC-12, OC-48, OC-192, and OC-768. Further, the optoelectronic module 100 can be configured to operate at various temperature ranges including, but not limited to, 0° C. to 70° C. and −40° C. to 85° C. In addition, although the example optoelectronic module 100 is configured to be substantially compliant with the CXP MSA, the optoelectronic module 100 can instead be configured to assume a variety of different form factors that are substantially compliant with various dual-PCB transceiver and/or transponder MSAs.

The optoelectronic module 100 includes a handle 104 operably connected to a latch assembly 106 that can be employed to insert the optoelectronic module 100 into a cage of a host device (not shown) and to extract the optoelectronic module 100 from the cage. The optoelectronic module 100 further includes a housing 108 that generally includes a top shell 110 and a bottom shell 112. The top and bottom shells 110 and 112 may be formed from zinc or copper-tungsten with nickel plating, for example. The top and bottom shells 110 and 112 of the optoelectronic module 100 are held together with a fastener 114, such as a screw for example With reference now to FIG. 1C, additional aspects of the optoelectronic module 100 are disclosed. In particular, FIG. 1C discloses that the top and bottom shells 110 and 112 of the optoelectronic module 100 partially surround a modified MPO-style male connector 116 attached to the communications cable 102. The modified MPO-style male connector 116 is configured to be permanently received within a modified MPO-style female connector, known as an alignment guide 118.

The top and bottom shells 110 and 112 also generally surround an electromagnetic radiation (EMR) assembly 120, a lens block 122, alignment pins 124, a transmitter lens array 128, a receiver lens array 126, a transmitter 132, a receiver 130, a flexible circuit 134, a transmitter PCB 138, a receiver PCB 136, a spacer 140, and a spacer 200. The alignment pins 124 facilitate the alignment of the alignment guide 118, the EMR assembly 120, the lens block 122, and the transmitter and receiver lens arrays 128 and 126. The lens block 122 holds the transmitter and receiver lens arrays 128 and 126. The transmitter 132 and the receiver 130 are physically and electrically connected to the flexible circuit 134, which is in turn physically and electrically connected to both the transmitter PCB 138 and the receiver PCB 136. The spacer 140 and the spacer 200 separate the transmitter PCB 138 from the receiver PCB 136.

In operation, incoming optical data signals travel from the fiber-optic communications cable 102, through the modified MPO-style male connector 116, the alignment guide 118, the EMR assembly 120, the lens block 122, and the receiver lens array 126, and are received by the receiver 130. The receiver 130 then converts the incoming optical data signal into electrical data signals. These electrical data signals are then passed along conductive traces (not shown) on the flexible circuit 134 to receiver circuitry (not shown) on the receiver PCB 136. After being refined by the receiver circuitry, these electrical data signals are then passed to the host device (not shown) into which the optoelectronic module 100 is positioned via the edge connector 136a.

Similarly, outgoing electrical data signals travel from the host device (not shown) into which the optoelectronic module 100 is positioned into the transmitter PCB 138 via the edge connector 138b. Transmitter circuitry (not shown) on the transmitter PCB 138 refines these electrical data signals before passing them along conductive traces (not shown) on the flexible circuit 134 to the transmitter 132. The transmitter 132 converts these electrical data signals into optical data signals before transmitting them through the transmitter lens array 128, the lens block 122, the EMR assembly 120, the alignment guide 118, and the modified MPO-style male connector 116, and into the fiber-optic communications cable 102. In this manner, the host device (not shown) into which the optoelectronic module 100 is positioned can communicate electronically with a distance host device (not shown).

The transmitter 132 may be an optical transmitter such as a vertical cavity surface emitting laser (VCSEL), or the like. The receiver 130 may be an optical receiver such as a photodetector, or the like. For example, the transmitter 132 may be a twelve (12) channel VCSEL array and the receiver 130 may be a twelve (12) channel PIN photodetector array. In some embodiments, only the transmitter 132 or the receiver 130 is included in the optoelectronic module 100, such that the optoelectronic module 100 becomes only an optical transmitter or receiver, respectively.

2. Example Optoelectronic Module Housing and Printed Circuit Board

Figure 1C:
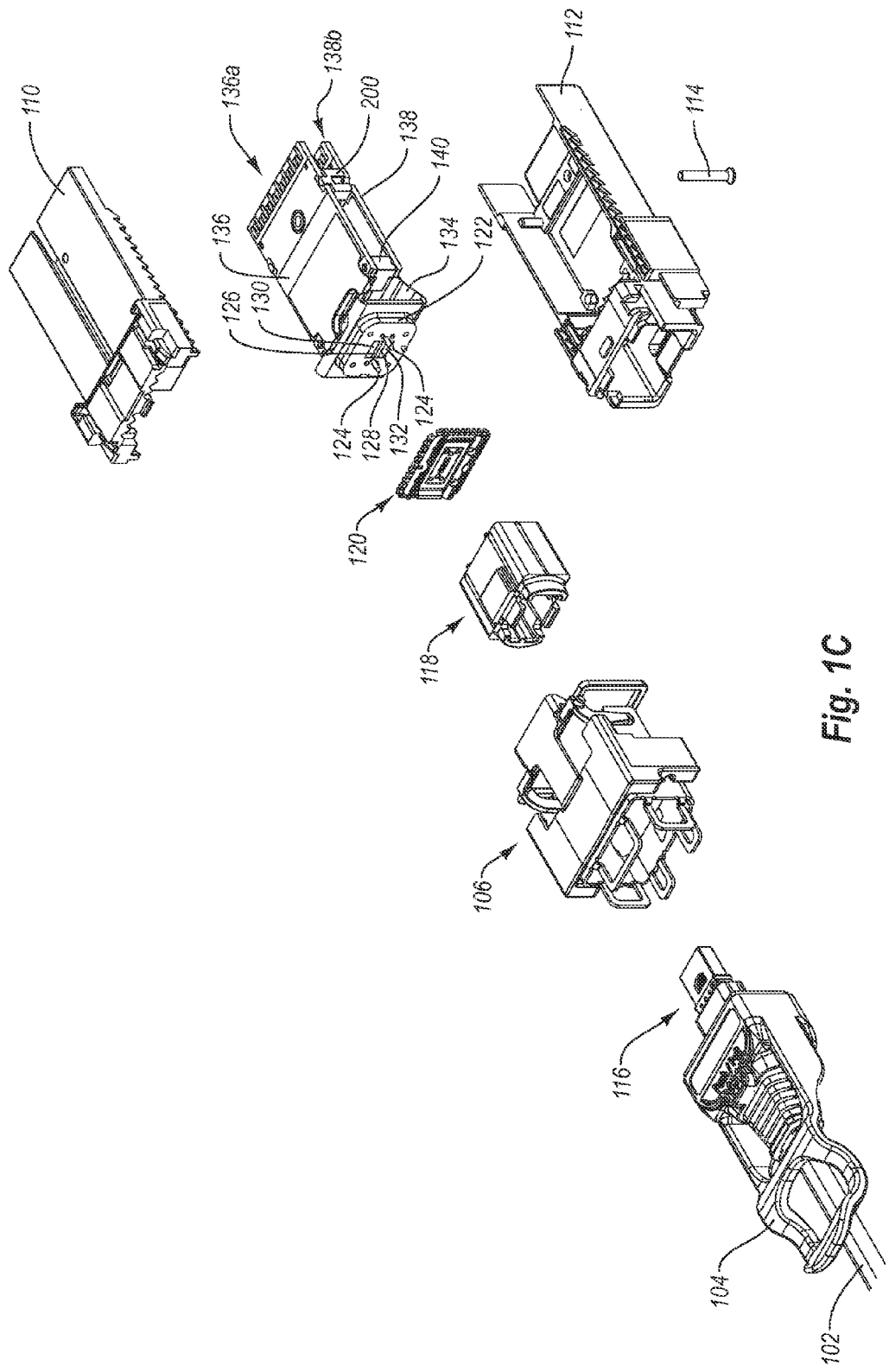
FIG. 1C is an exploded top front perspective view of the example optoelectronic module and attached ribbon cable of FIG. 1A and an example internal spacer of the optoelectronic module.
Figure 1D:
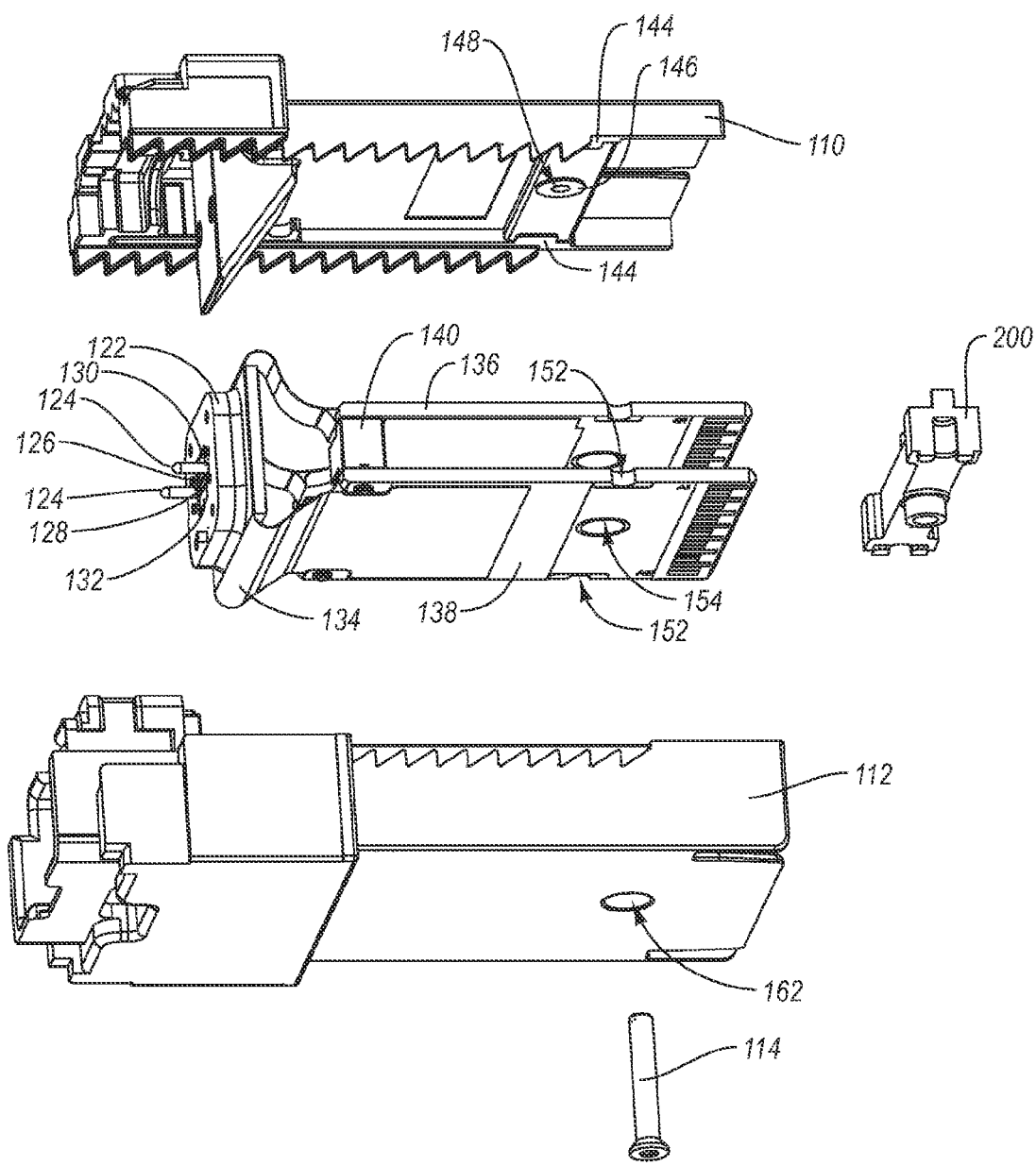
FIG. 1D is an exploded bottom front perspective view of a portion of the example optoelectronic module of FIG. 1A including the example spacer of FIG. 1C.
Figure 1E:
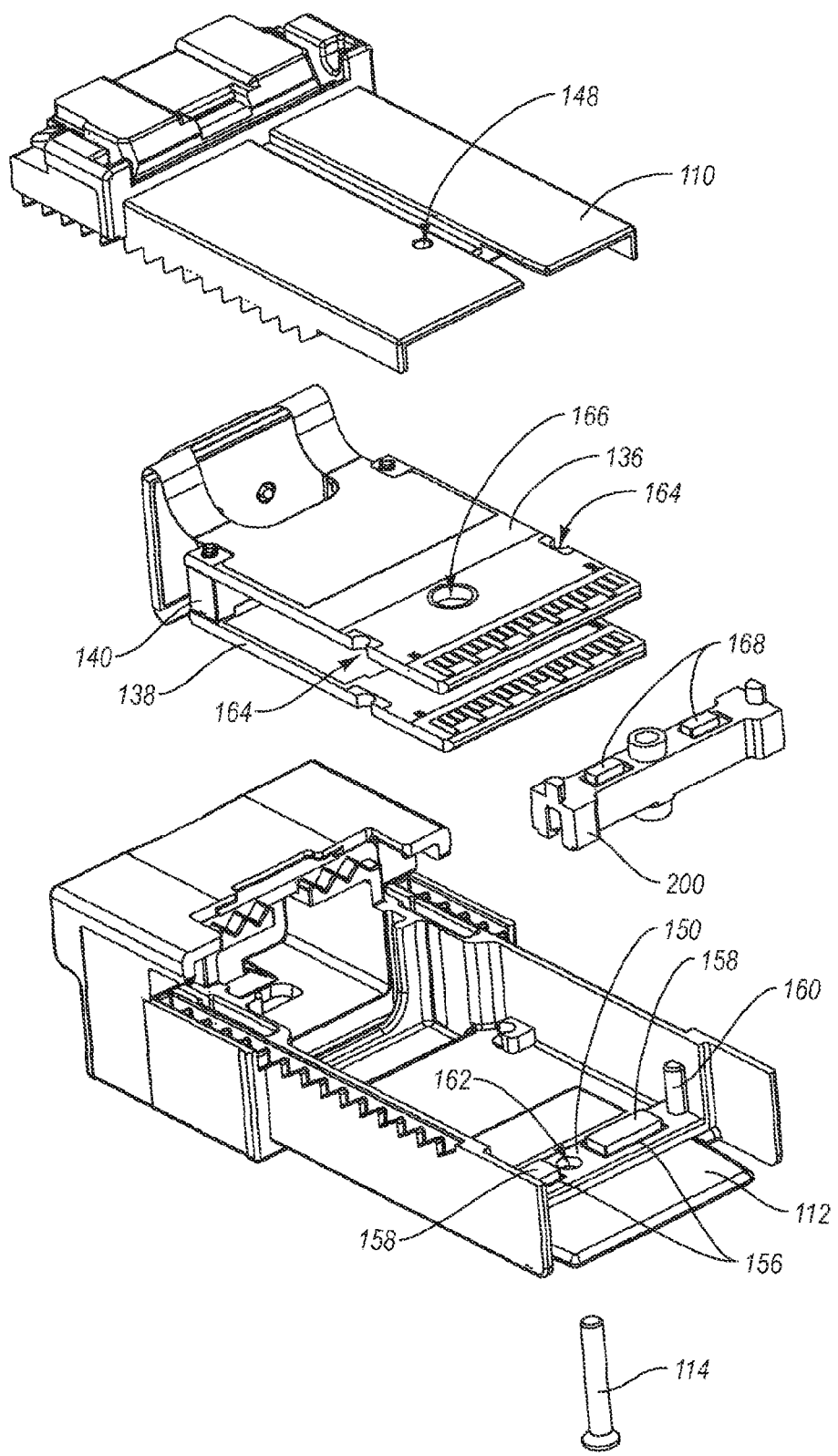
FIG. 1E is an exploded top rear perspective view of a portion of the example optoelectronic module of FIG. 1A including the example spacer of FIG. 1C.

With continuing reference to FIG. 1C, and with reference also to FIGS. 1D and 1E, additional aspects of the top and bottom shells 110 and 112 and the transmitter and receiver PCB 138 and 136 are disclosed. As disclosed in FIG. 1D, the top shell 110 defines raised datum surfaces 144 and 146. The top shell 110 also defines a threaded opening 148 in the raised datum surface 146 with which threads on the fastener 114 can engage during assembly. Also, the transmitter PCB 138 defines openings 152 and 154.

As disclosed in FIG. 1E, the bottom shell 112 includes an inside surface 150 in which recessed surfaces 156 are defined and in which bottom compressible structures 158 are positioned. The bottom shell 112 also defines sidewall ridges 160 (only one of which is shown in FIG. 1E) against each of the sidewalls of the bottom shell 112. The bottom shell 112 further defines an opening 162 through which the fastener 114 can be inserted during assembly. Further, the receiver PCB 136 defines openings 164 and 166.

3. Example Spacer

Figure 2A:
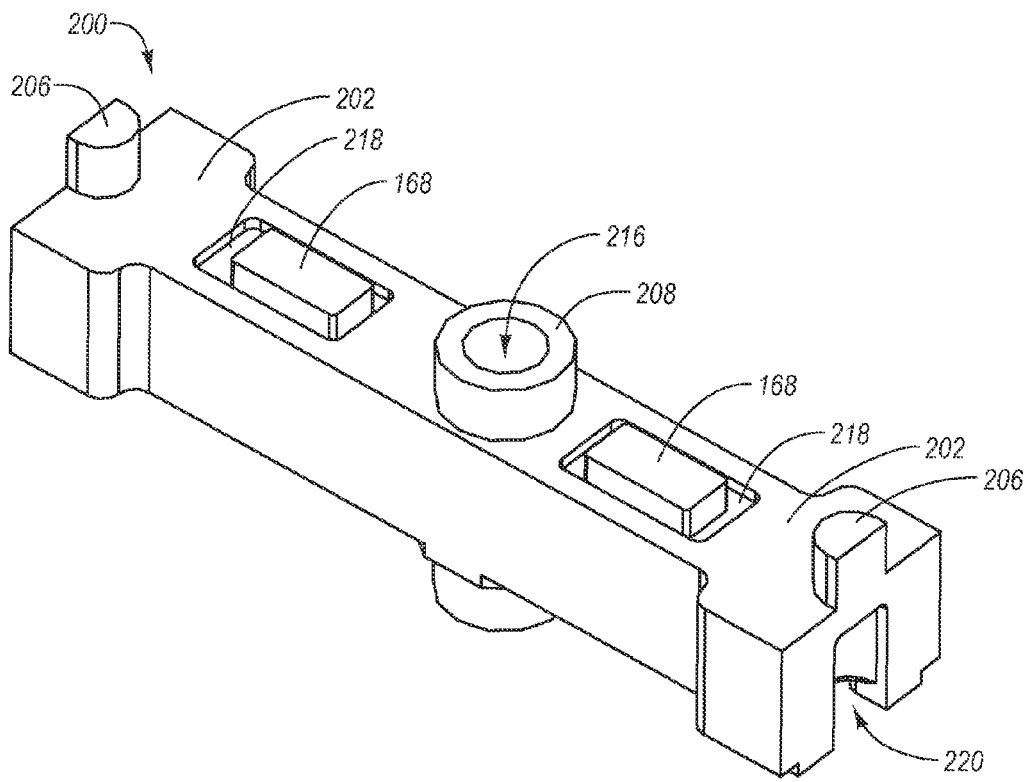
FIG. 2A is a top front perspective view of the spacer of FIG. 1C.
Figure 2B:
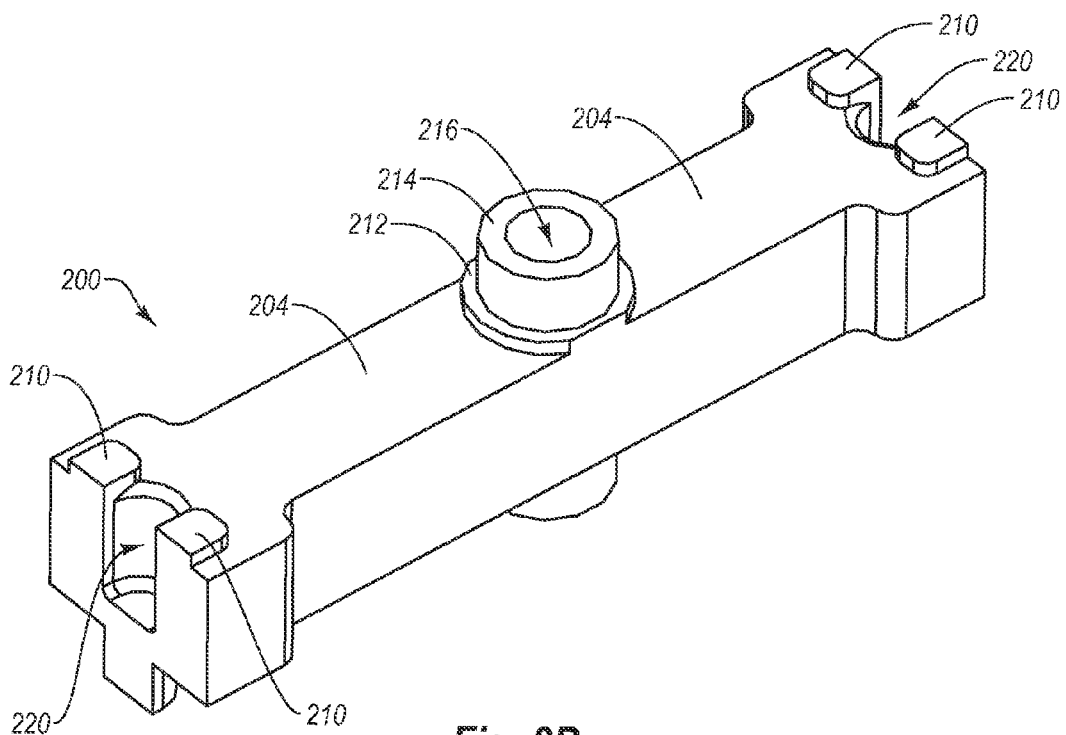
FIG. 2B is a bottom rear perspective view of the spacer of FIG. 1C.
Figure 3:
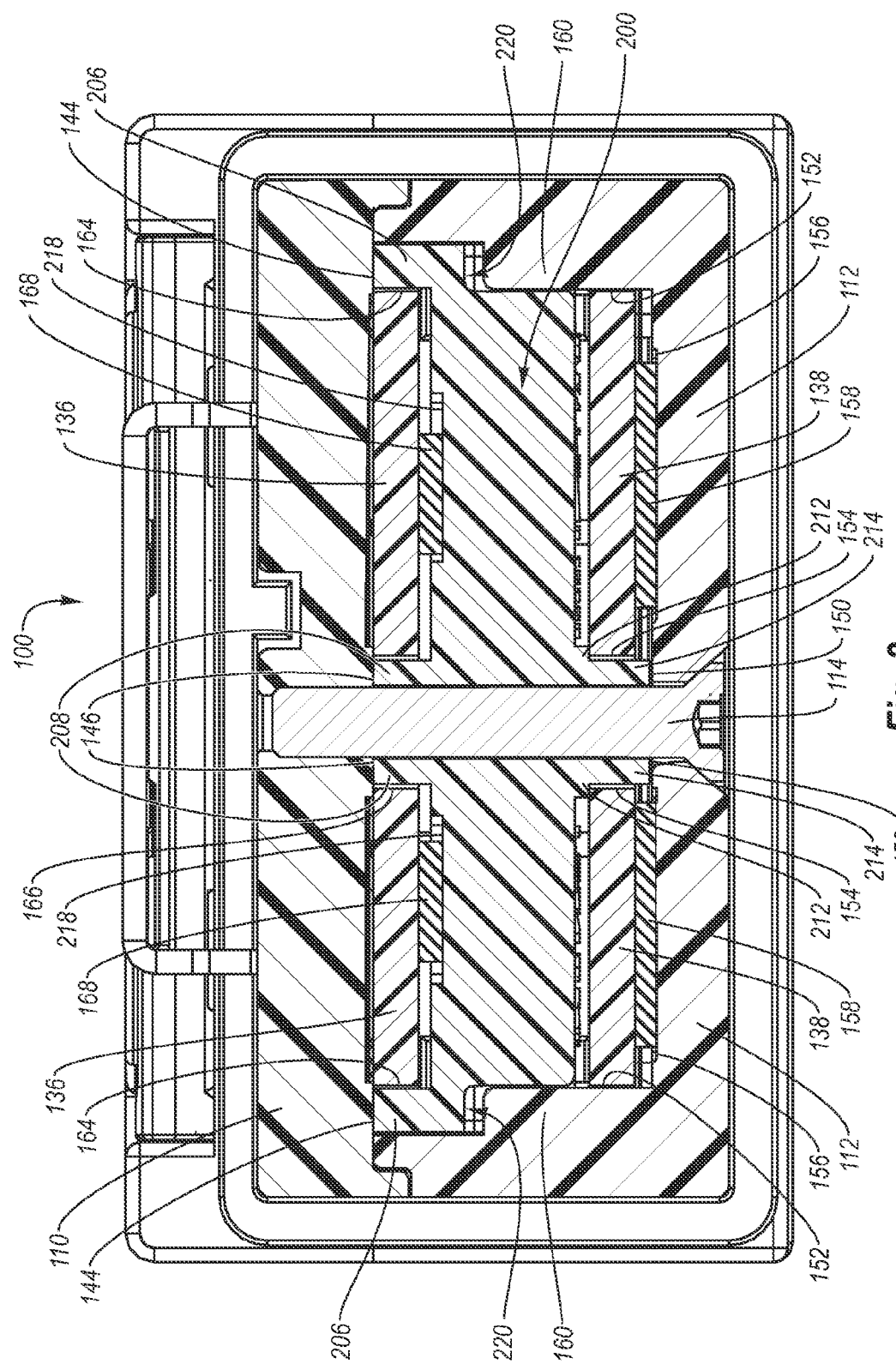
FIG. 3 is a cross-sectional view of the example optoelectronic module of FIG. 1A including the example spacer of FIG. 1C.

With reference now to FIGS. 2A, 2B, and 3, additional aspects of the example spacer 200 and the optoelectronic module 100 are disclosed. As disclosed in FIGS. 2A and 2B, the example spacer 200 includes a top surface 202, a bottom surface 204, top posts 206 and 208 extending from the top surface 202, raised surfaces 210 and 212 on the bottom surface 204, a bottom post 214 extending from the raised surface 212, and an opening 216 that extends through the spacer from the distal end of the top post 208 to the distal end of the bottom post 214. The spacer 200 also defines recessed surfaces 218 in the top surface 202 in which top compressible structures 168 are positioned. The spacer 200 also defines recessed portions 220 configured to receive the sidewall ridges 160 of the bottom shell 112 (see FIG. 1E).

The bottom and top compressible structures 158 and 168 disclosed herein may be dielectric silicone rubber pads formed from silicone rubber KE-5620W-U, for example. Being formed from a dielectric enables the compressible structures 158 and 168 to be employed to mechanically secure a PCB without causing electrical interference with the electronic circuitry of the PCB. The bottom and top compressible structures 158 and 168 may further be formed as other structures having elastic properties including, but not limited to, diamond shaped metal springs, coil springs, s-bend springs, compressible polymers, cantilevers, or any other structure(s) of comparable functionality.

As disclosed in FIG. 3, the spacer 200 prevents warping of the top and bottom shells 110 and 112 and the transmitter and receiver PCBs 138 and 136 due to over-tightening of the fastener 114. In particular, FIG. 3 discloses that the top posts 206 and 208 extend through openings 164 and 166 in the receiver PCB 136 to contact the raised datum surfaces 144 and 146 of the top shell 110. Further, the bottom post 214 extends through the opening 154 in the transmitter PCB 138 to contact the inside surface 150 of the bottom shell 112. Also the fastener 114 extends through the opening 162 defined in the bottom shell 112 (see FIGS. 1D and 1E) and the opening 216 defined in the spacer 200 in order to engage the threaded opening 148 defined in the top shell 110. Thus, the top posts 206 and 208 and the bottom post 214 of the spacer 200 prevent inward warping of the top and bottom shells 110 and 112 and the transmitter and receiver PCBs 138 and 136 due to over-tightening of the fastener 114. This warping prevention can enable the top shell 110 and/or the bottom shell 112 to function as a heat sink to dissipate heat generated within the optoelectronic module 100.

As also disclosed in FIG. 3, the spacer 200 enables the transmitter and receiver PCBs 138 and 136 to be properly vertically positioned with respect to the top and bottom shells 110 and 112. In particular, FIG. 3 discloses that the top compressible structures 168 are compressed between the recessed portions 218 of the spacer 200 and the receiver PCB 136, thus biasing the receiver PCB 136 against the top shell 110. As the footprints of the raised datum surfaces 144 and 146 are larger than the footprints of the posts 206 and 208, the top compressible structures 168 bias the receiver PCB 136 against the raised datum surfaces 144 and 146 of the top shell 110. Further, the bottom compressible structures 158 are compressed between the recessed portions 156 of the bottom shell 112 and the transmitter PCB 138, thus biasing the transmitter PCB 138 against the raised surfaces 210 (see FIG. 2B) and 212 on the bottom surface 204 of the spacer 200. Thus, the spacer 200 enables the transmitter and receiver PCBs 138 and 136 to be properly vertically positioned with respect to the top and bottom shells 110 and 112. More particularly, the spacer 200 enables the optoelectronic module 100 to comply with the transmitter and receiver PCBs 138 and 136 positioning required by the CXP MSA relative to the top surface of the top shell 110.

As further disclosed in FIG. 3, the spacer 200 enables the transmitter and receiver PCBs 138 and 136 to be properly horizontally positioned with respect to the top and bottom shells 110 and 112. In particular, FIG. 3 discloses that the sidewall ridges 160 defined in the bottom shell 112 are received within the recessed portion 220 of the spacer 200 and the openings 152 of the transmitter PCB 138. The sidewall ridges 160 thus cooperate with the recessed portions 220, the top posts 206, the openings 164, and the openings 152 to prevent the transmitter and receiver PCBs 138 and 136 from rotating or shifting forward or backward within the bottom shell 112.

The example embodiments disclosed herein may be embodied in other specific forms. The example embodiments disclosed herein are to be considered in all respects only as illustrative and not restrictive.

What is claimed is:

1. An optoelectronic module comprising:
   a housing comprising a top shell and a bottom shell;
   top and bottom printed circuit boards (PCBs) at least partially enclosed within the housing; and
   a spacer positioned between the first and second PCBs, the spacer comprising:
      top and bottom surfaces;
      a plurality of top posts extending from the top surface, the top posts extending through openings in the top PCB to contact one or more inside surfaces of the top shell; and a bottom post extending from the bottom surface and extending through an opening in the bottom PCB to contact an inside surface of the bottom shell.

2. The optoelectronic module as recited in claim 1, wherein the spacer further comprises:
an opening that extends through the spacer from a distal end of one of the top posts to a distal end of the bottom post.

3. The optoelectronic module as recited in claim 1, wherein the spacer further comprises:
a plurality of raised surfaces on the bottom surface and in contact with the bottom PCB.

4. The optoelectronic module as recited in claim 1, wherein the spacer further comprises:
recessed portions defined in the top surface with compressible structures positioned therein to bias the top PCB against the inside surfaces of the top shell.

5. The optoelectronic module as recited in claim 1, wherein the spacer further comprises:
recessed portions defined in the spacer between the top and bottom surfaces with ridges defined in sidewalls of the bottom shell positioned therein.

6. An active cable comprising:
a communications cable comprising one or more optical fibers, the communications cable having first and second ends; and
first and second optoelectronic modules, each as recited in claim 1, attached to the first and second ends of the communications cable, respectively.

7. An optoelectronic module comprising:
a housing comprising a top shell and a bottom shell;
top and bottom PCBs at least partially enclosed within the housing;
a spacer positioned between the top and bottom PCBs;
top compressible structures compressed between the spacer and the top PCB, the top compressible structures biasing the top PCB against the top shell; and
bottom compressible structures compressed between the bottom shell and the bottom PCB, the bottom compressible structures biasing the bottom PCB against the spacer.

8. The optoelectronic module as recited in claim 7, wherein the top and bottom compressible structures comprise dielectric silicone rubber pads.

9. The optoelectronic module as recited in claim 7, wherein the spacer comprises:
top and bottom surfaces; and
a plurality of top posts extending from the top surface, the top posts extending through openings in the top PCB to contact inside surfaces of the top shell.

10. The optoelectronic module as recited in claim 9, wherein the spacer further comprises a bottom post extending from the bottom surface, the bottom post extending through an opening in the bottom PCB to contact an inside surface of the bottom shell.

11. The optoelectronic module as recited in claim 10, further comprising a fastener fastening the bottom shell to the top shell, wherein the fastener extends through an opening that extends through the spacer from a distal end of one of the top posts to a distal end of the bottom post.

12. The optoelectronic module as recited in claim 11, wherein the spacer further comprises a plurality of raised surfaces on the bottom surface that are in contact with the bottom PCB.

13. The optoelectronic module as recited in claim 12, wherein the bottom shell further comprises recessed portions defined in an inside surface of the bottom shell, the bottom compressible structures being at least partially positioned within the recessed portions in order to bias the bottom PCB against the raised surfaces on the bottom surface of the spacer.

14. The optoelectronic module as recited in claim 9, wherein the bottom shell defines vertical ridges and the spacer defines recessed portions between the top and bottom surfaces in which the vertical ridges are positioned.

15. The optoelectronic module as recited in claim 7, wherein the optoelectronic module is substantially compliant with the CXP MSA.

16. An active cable comprising:
a communications cable comprising one or more optical fibers, the communications cable having first and second ends; and
first and second optoelectronic modules attached to the first and second ends of the communications cable, respectively, each optoelectronic module comprising:
a housing comprising a top shell and a bottom shell, the top shell defining a plurality of datum surfaces;
top and bottom PCBs at least partially enclosed within the housing;
a spacer positioned between the top and bottom PCBs, the spacer comprising top and bottom surfaces and a plurality of top posts extending from the top surface, the top posts extending through openings in the top PCB to contact the datum surfaces of the top shell;
top compressible structures compressed between the spacer and the top PCB, the top compressible structures biasing the top PCB against the datum surfaces of the top shell; and
bottom compressible structures compressed between the bottom shell and the bottom PCB, the bottom compressible structures biasing the bottom PCB against the spacer.

17. The active cable as recited in claim 16, wherein the spacer of each optoelectronic module further comprises a bottom post extending from the bottom surface, the bottom post extending through an opening in the bottom PCB to contact an inside surface of the bottom shell.

18. The active cable as recited in claim 16, wherein each optoelectronic module further comprises a screw that fastens the bottom shell to the top shell, wherein the screw is at least partially positioned in an opening that extends through the spacer from a distal end of one of the top posts to a distal end of the bottom post.

19. The active cable as recited in claim 16, wherein each bottom shell defines vertical ridges that are positioned within recessed portions defined in the spacer between the top and bottom surfaces of the spacer.

20. The active cable as recited in claim 16, wherein each optoelectronic module is substantially compliant with the CXP MSA.

* * * * *